United States Patent

Shimomura et al.

[11] Patent Number: 5,737,381
[45] Date of Patent: Apr. 7, 1998

[54] COUNTING DEVICE

[75] Inventors: Takehiko Shimomura; Nobusuke Abe; Yoshikazu Satoh, all of Tokyo, Japan

[73] Assignees: Mitsubishi Denki Kabushiki Kaisha, Tokyo; Mitsubishi Electric Semiconductor Software Co., Ltd., Itami, Japan

[21] Appl. No.: 668,130

[22] Filed: Jun. 21, 1996

[30] Foreign Application Priority Data

Feb. 16, 1996 [JP] Japan ............................ 8-038237

[51] Int. Cl.[6] .................................................. H03K 23/66
[52] U.S. Cl. .................................. 377/52; 377/55; 395/439
[58] Field of Search ............................ 377/55, 52, 26; 395/439

[56] References Cited

U.S. PATENT DOCUMENTS

| | | | |
|---|---|---|---|
| 4,789,951 | 12/1988 | Birkner et al. ........................ | 326/40 |
| 5,159,696 | 10/1992 | Hartnett ............................... | 377/52 |
| 5,339,343 | 8/1994 | Hashimoto ............................ | 377/55 |
| 5,371,773 | 12/1994 | Ihara et al. ............................ | 377/55 |
| 5,432,830 | 7/1995 | Bonnot ................................. | 377/55 |

OTHER PUBLICATIONS

*Mitsubishi User's Manual*, Mitsubishi Electric Corporation (Dec. 1993).

*Primary Examiner*—Margaret Rose Wambach
*Attorney, Agent, or Firm*—Burns, Doane, Swecker & Mathis, LLP

[57] ABSTRACT

The invention provides a counting device and a direct memory access system using the counting device. In the counting device, a carry/borrow signal to be supplied from a predetermined one-bit counter among a plurality of one-bit counters to another one-bit counter in the subsequent stage is inputted to an input/cutoff element such as an AND circuit. The input/cutoff element is also supplied with a control signal for controlling the input/cutoff of the carry/borrow signal. Thus, the range of the values to be counted can be changed.

12 Claims, 9 Drawing Sheets

COUNTING DEVICE

BACKGROUND OF THE INVENTION

1. Field of the Invention

The present invention relates to a counting device which can change the range of count values to be repeatedly counted.

2. Description of Related Art

In a conventional counter, the bit length is determined depending upon the hardware. In the case of counting up values, the counter counts from the minimum value, that is, an initial value, to the maximum value, and then, repeatedly counts from the initial value again. Therefore, in order to change the range of the count values to be repeatedly counted by the counter, the counter is required to be provided with hardware which functions to change the range.

Figure 1:
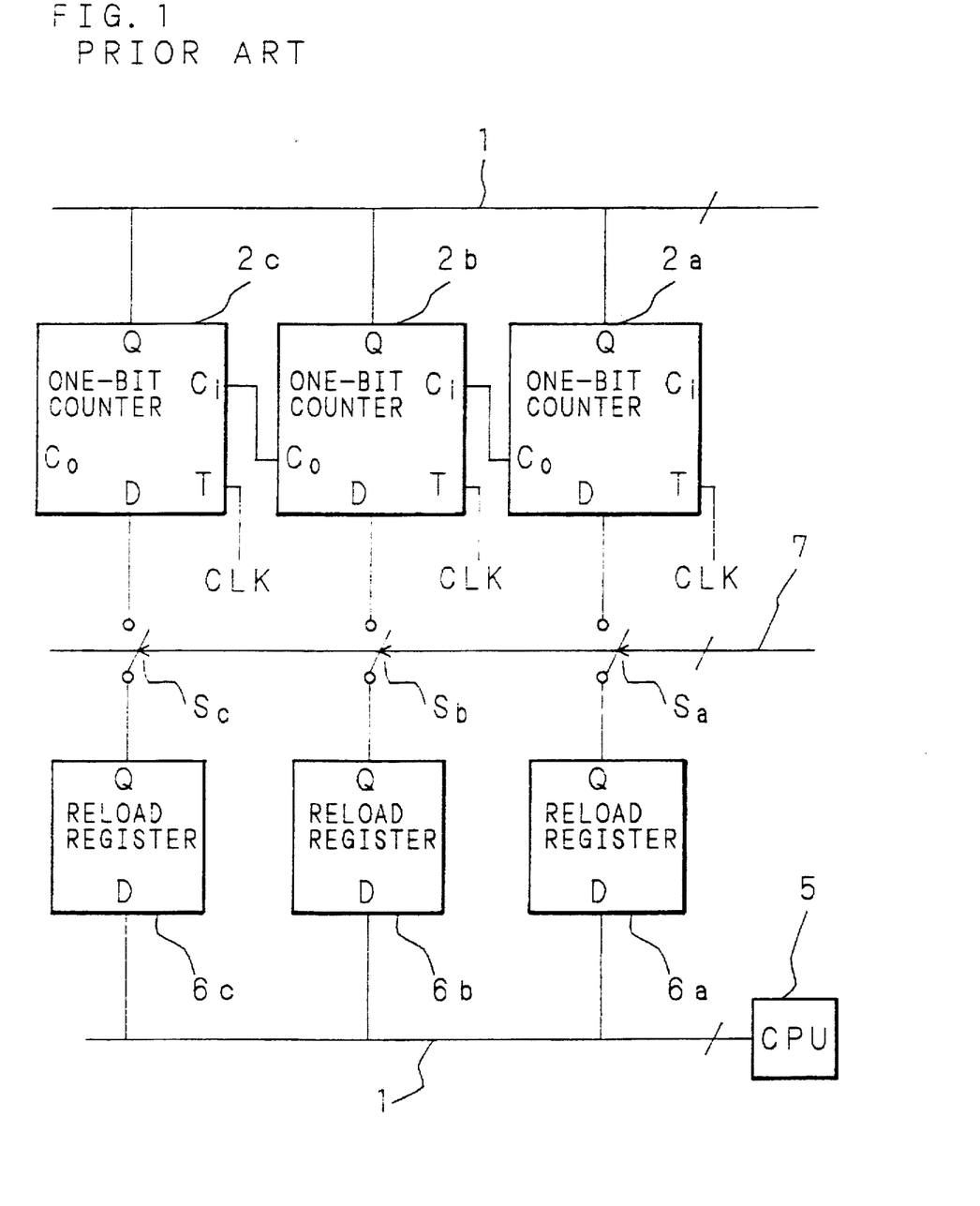
FIG. 1 is a block diagram for showing the configuration of a conventional counter.

FIG. 1 is a block diagram for showing the configuration of a conventional counter which can change the range of count values to be repeatedly counted. Count values outputted from the output terminals Q of respective one-bit counters $2a$, $2b$ and $2c$ are supplied to a system bus 1. A carry signal outputted from the carry signal output terminal $C_o$ of the one-bit counter $2a$ through the count operation thereof is supplied to the carry signal input terminal Ct of the one-bit counter $2b$. Similarly, a carry signal outputted from the carry signal output terminal $C_o$ of the one-bit counter $2b$ is supplied to the carry signal input terminal $C_i$ of the one-bit counter $2c$. Each of the trigger terminals T of the one-bit counters $2a$, $2b$ and $2c$ is supplied with a clock CLK for the count operation.

Each of the input terminals D of reload registers $6a$, $6b$ and $6c$ is supplied with a reload value by a CPU 5 through the system bus 1. The reload value held by the reload register $6a$ is supplied to the input terminal D of the one-bit counter $2a$ through a switch $S_a$, and the reload value held by the reload register $6b$ is supplied to the input terminal D of the one-bit counter $2b$ through a switch $S_b$. The reload value held by the reload register $6c$ is supplied to the input terminal D of the one-bit counter $2c$ through a switch $S_c$. The switches $S_a$, $S_b$ and $S_c$ are turned on/off under the control of a reload signal 7.

Now, the operation of this counter will be described. When the count values of the one-bit counters $2a$, $2b$ and $2c$ are initialized to be "0" with the switches $S_a$, $S_b$ and $S_c$ in an off state, the count values of three bits become "0, 0, 0". When a first clock CLK is then generated, the count value of the one-bit counter $2a$ changes from "1" to "1", resulting in the count values of the three bits of "0, 0, 1". When a second clock CLK is subsequently generated, the count value of the one-bit counter $2a$ changes from "1" to "0". Simultaneously, a carry signal is generated to be inputted to the subsequent one-bit counter $2b$, so that the count value of the one-bit counter $2b$ changes from "0" to "1", resulting in the count values of the three bits of "0, 1, 0". When a third clock CLK is subsequently generated, the count value of the one-bit counter $2a$ changes to "1". In this case, a carry signal is not generated, and hence, the count value of the one-bit counter $2b$ remains to be "1", resulting in the count values of the three bits of "0, 1, 1".

Then, when a fourth clock CLK is generated, the count value of the one-bit counter $2a$ changes to "0", and a carry signal is simultaneously generated. The carry signal is supplied to the one-bit counter $2b$, so that the count value of the one-bit counter $2b$ changes from "1" to "0". In this case, the one-bit counter $2b$ generates a carry signal to be supplied to the one-bit counter $2c$. Owing to the carry signal, the count value of the one-bit counter $2c$ changes from "0" to "1", resulting in the count values of the three bits of "1, 0, 0". Thereafter, the one-bit counters $2a$, $2b$ and $2c$ conduct their count operations in the aforementioned manner every time a clock is generated. As a result, the count values of the three bits change in the following order: "0, 0, 0", "0, 0, 1", "0, 1, 0", "0, 1, 1", "1, 0, 0", "1, 0, 1", "1, 1, 1". Thus, values in the range between 0 and 7 are counted.

After all the count values of the one-bit counters $2c$, $2b$ and $2a$ become "1", generation of a subsequent clock changes the count value of the one-bit counter $2a$ from "1" to "0", and a carry signal is outputted. As a result, the count value of the one-bit counter $2b$ changes from "1" to "0". The one-bit counter $2b$ then generates a carry signal, thereby changing the count value of the one-bit counter $2c$ from "1" to "0". Thus, the count values of the three bits return to the initial values of "0, 0, 0". The counter repeats this count operation thereafter.

In the case where the count values of the three bits are to be repeatedly counted in the range between "1, 0, 0" and "1, 1, 1", the reload registers $6c$, $6b$ and $6a$ are supplied with reload values of "1", "0" and "0", respectively from the system bus 1. Then, a reload signal 7 is generated, so as to turn on the switches $S_c$, $S_b$ and $S_a$. Thus, the reload values of the reload registers $6c$, $6b$ and $6a$ are inputted to the one-bit counters $2c$, $2b$ and $2a$, respectively, thereby setting the count values of the one-bit counters $2c$, $2b$ and $2a$ at "1", "0" and "0", respectively, namely, setting the initial count values at "1, 0, 0". After this, when a clock CLK is generated, the count values of the one-bit counters $2c$, $2b$ and $2a$ change through the aforementioned operation. As a result, the count values of the three bits change in the order of "1, 0, 0", "1 0, 1", "1, 1, 0" and "1, 1, 1".

When the count values of the one-bit counters $2a$, $2b$ and $2c$ become "1", "1" and "1", respectively, a reload signal 7 is generated by the CPU 5, so as to turn on the switches $S_c$, $S_b$ and $S_a$. As a result, the reload values of the reload registers $6c$, $6b$ and $6a$ are inputted to the one-bit counters $2c$, $2b$ and $2a$, respectively, thereby setting the count values of the one-bit counters $2c$, $2b$ and $2a$ at "1", "0" and "0", respectively. Thereafter, the aforementioned count operation is repeated, thereby repeatedly counting values in the range between 4 and 7.

In such a conventional counter, when count values in a predetermined range are to be repeatedly counted, the count operation for the count values in the desired range can be repeated by once setting the initial values in the reload registers. Thus, there is no need to set the reload values every time the count operation is repeated, and hence, the load of the CPU for setting the reload values does not increase. Nevertheless, it is necessary to provide reload registers in the same number as that of the one-bit counters, which causes a disadvantage that the reload registers occupy a large pattern area. The pattern area occupied by the reload registers can be decreased by eliminating the reload resisters. However, the elimination of the reload registers leads to another disadvantage of increased load of the CPU because, when the reload registers are eliminated, it is necessary to supply an initial count value by the CPU during the count operation or every time the count value is overflowed. Accordingly, the application of the conventional counter to a system inevitably increases the size of the entire system as well as the load of the CPU.

SUMMARY OF THE INVENTION

The present invention was devised to overcome the aforementioned problems, and one object of the invention is providing a counting device in which the range of count values to be repeatedly counted can be changed and which can attain a compact system including a CPU as well as can prevent increase of the load of the CPU.

The counting device of this invention comprises a plurality of one-bit counters connected with one another, so that a carry/borrow signal generated during a count operation is supplied from one of the one-bit counters to another one-bit counter in a subsequent stage; means for supplying an instruction to repeatedly count the count values in a range corresponding to a part of the one-bit counters; means for outputting a mask signal, for masking the carry/borrow signal, in accordance with the instruction; and means for receiving the carry/borrow signal outputted by a predetermined one-bit counter so as to halt a count operation of a one-bit counter in a subsequent stage of the predetermined one-bit counter in accordance with the mask signal.

Accordingly, when, for example, a CPU instructs to repeatedly count the count values in a part of the entire bit range, the mask signal is outputted from, for example, a register or a memory to, for example, an AND circuit, a transfer gate or an analog switch, thereby masking the carry signal or the borrow signal. Thus, the carry signal or the borrow signal is not inputted to the one-bit counter(s) corresponding to higher bit(s) than a predetermined bit, resulting in decreasing the range of the count values. Furthermore, when the carry signal or the borrow signal is not masked, the one-bit counters corresponding to all the bits conduct the count operations so as to change the count values thereof. As a result, the range of the count values to be repeatedly counted is enlarged. In this manner, by using the mask signal, the range of the count values to be repeatedly counted can be changed.

Alternatively, the counting device of this invention comprises a plurality of one-bit counters connected with one another so that a carry/borrow signal generated during a count operation is supplied from one of the one-bit counters to another one-bit counter in a subsequent stage; input/cutoff means interposed between a predetermined one-bit counter and another one-bit counter in a subsequent stage of the predetermined one-bit counter for inputting/cutting off the carry/borrow signal to be supplied to the one-bit counter in the subsequent stage; and means for outputting a control signal for the input/cutoff means. Accordingly, when the input/cutoff means such as an AND circuit, a transfer gate and an analog switch is placed in a cut off state by an input/cutoff control signal outputted by a register or a memory, the carry signal or the borrow signal cannot be inputted to a predetermined one-bit counter. As a result, the count operation of the predetermined one-bit counter is halted and the count value thereof is not changed. Thus, the range of the count values can be decreased. When the input/cutoff means is in an input state, the carry signal or the borrow signal is inputted also to the predetermined one-bit counter, and hence, all the one-bit counters conduct the count operations. Thus, the range of the count values is enlarged. In this manner, in accordance with the input/cutoff control signal outputted by the input/cutoff signal outputting means, the range of the count values repeatedly counted can be changed.

Furthermore, the direct memory access system of this invention comprises a counting device which uses a count value as an address in a memory, and the counting device includes a plurality of one-bit counters connected with one another, so that a carry/borrow signal generated during a count operation is supplied from one of the one-bit counters to another one-bit counter in a subsequent stage; means for supplying an instruction to repeatedly count count values in a range corresponding to a part of the one-bit counters; means for outputting a mask signal, for masking the carry/borrow signal, in accordance with the instruction; and means for receiving the carry/borrow signal outputted by a predetermined one-bit counter so as to halt a count operation of another one-bit counter in a subsequent stage of the predetermined one-bit counter in accordance with the mask signal.

Accordingly, since the counting device is very small, the direct memory access system can be made compact. In addition, when the range of the count values is changed, there is no need to reload each one-bit counter with an initial value every time the count value is overflowed or underflowed, and the load of the CPU is prevented from increasing.

The above and further objects and features of the invention will more fully be apparent from the following detailed description with accompanying drawings.

DESCRIPTION OF THE PREFERRED INVENTION

The present invention will now be described in detail referring to the accompanying drawings illustrating the embodiments thereof.

Embodiment 1

Figure 2:
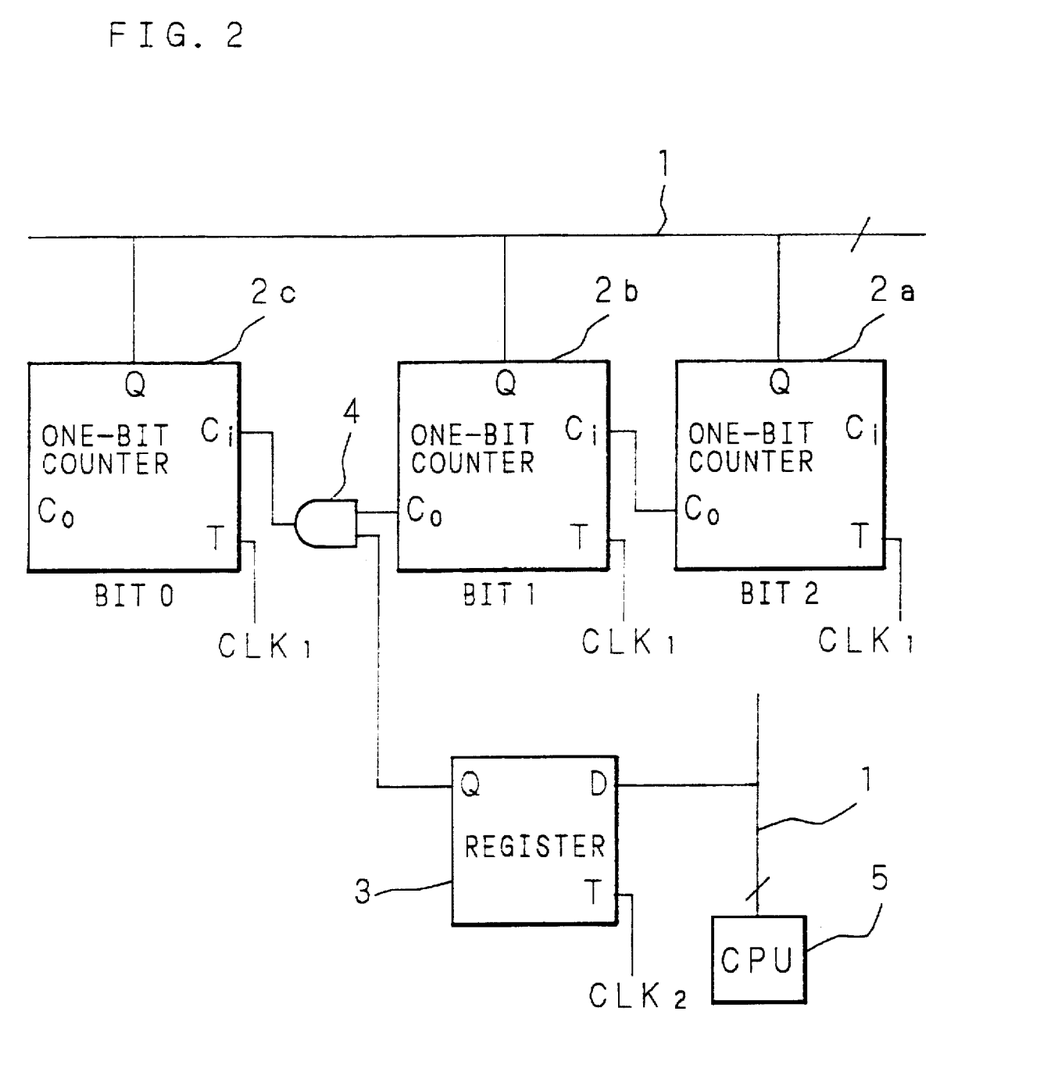
FIG. 2 is a block diagram for showing the configuration of a counting device according to a first embodiment of the invention.

FIG. 2 is a block diagram for showing the configuration of a counting device according to the first embodiment of the invention.

One-bit counters $2a$, $2b$ and $2c$, each of which also serves as a flip-flop, output their count values from their output terminals Q to a system bus 1. A carry signal outputted from the carry signal output terminal $C_o$ of the one-bit counter $2a$ through the count operation thereof is inputted to the carry signal input terminal $C_i$ of the one-bit counter $2b$. A carry signal outputted from the carry signal output terminal $C_o$ of the one-bit counter $2b$ through the count operation thereof is inputted to a first input terminal of an AND circuit 4 serving as input/cutoff means. The output signal of the AND circuit 4 is supplied to the carry signal input terminal $C_i$ of the one-bit counter $2c$. Each of the trigger terminals T of the one-bit counters $2a$, $2b$ and $2c$ is supplied with a clock $CLK_1$ for the count operation.

The input terminal D of a register 3 serving as input/cutoff signal outputting means is supplied with input/cutoff data by a CPU 5 connected with the system bus 1. An input/cutoff signal corresponding to the input/cutoff data stored in the register 3 is supplied to a second input terminal of the AND circuit 4. The trigger terminal T of the register 3 is supplied with a clock $CLK_2$ for storing the input/cutoff data. The one-bit counters $2a$, $2b$ and $2c$ together form a three-bit counter 15.

The counter 15 having the aforementioned configuration is operated as follows:

When all input/cutoff datum of "1" is supplied to the register 3 through the system bus 1 by the CPU 5 to be stored in the register 3, an input/cutoff signal of "1" derived from the input/cutoff datum is outputted from the output terminal Q of the register 3 to be inputted to the second input terminal of the AND circuit 4. At this point, when the count values of the one-bit counters $2c$, $2b$ and $2a$ are respectively initialized to be "0" by the CPU 5, the count values of the three bits become "0, 0, 0". When a first clock $CLK_1$ is then generated, the count value of the one-bit counter $2a$ changes from "0" to "1", resulting in the count values of the three bits of "0, 0, 1".

When a second clock $CLK_1$ is subsequently generated, the count value of the one-bit counter $2a$ changes from "1" to "1", and a carry signal is simultaneously generated so as to be inputted to the carry signal input terminal $C_i$ of the subsequent one-bit counter $2b$. As a result, the count value of the one-bit counter $2b$ changes from "0" to "1", resulting in the count values of the three bits of "0, 1, 0".

When a third clock $CLK_1$ is subsequently generated, the count value of the one-bit counter $2a$ changes to "1". In this case, a carry signal is not generated, and hence, the count value of the one-bit counter $2b$ remains to be "1", resulting in the count values of the three bits of "0, 1, 1". When a fourth clock $CLK_1$ is generated, the count value of the one-bit counter $2a$ changes to "0" and a carry signal is generated. The carry signal is inputted to the carry signal input terminal $C_i$ of the one-bit counter $2b$, so as to change the count value of the one-bit counter $2b$ from "1" to "0". At this point, the one-bit counter $2b$ generates a carry signal, which is inputted to the first input terminal of the AND circuit 4. Since the second input terminal of the AND circuit 4 is supplied with the input/cutoff signal of "1" by the register 3, the logic of the AND circuit 4 holds. As a result, the AND circuit 4 outputs a carry signal, which is supplied to the carry signal input terminal $C_i$ of the subsequent one-bit counter $2c$.

Thus, the count value of the one-bit counter $2c$ changes from "0" to "1", resulting in the count values of the three bits of "1, 0, 0". Thereafter, the one-bit counters conduct their count-up operations in the aforementioned manner every time a clock is generated, thereby changing the count values of the three bits in the order of "0, 0, 0", "0, 0, 1", "0, 1, 0", "0, 1, 1", "1, 0, 0", "1, 0, 1", "1, 1, 0" and "1, 1, 1" Thus, values in the range between 0 and 7 are counted up.

After all the count values of the one-bit counters $2c$, $2b$ and $2a$ become "1", when a subsequent clock is generated, the count value of the one-bit counter $2a$ changes from "1" to "0" and a carry signal is generated. As a result, the count value of the one-bit counter $2b$ changes from "1" to "0". At this point, the one-bit counter $2b$ generates a carry signal, so as to change the count value of the one-bit counter $2c$ from "1" to "0", resulting in returning the count values of the three bits to "0, 0, 0", i.e. , the initial values. The counter 15 repeats this count-up operation, thereby repeatedly counting up the values in the range between 0 and 7.

In the case where the range of the count values to be repeatedly counted is set between 4 and 7, the count values of the one-bit counters $2c$, $2b$ and $2a$ are set at "1", "0" and "0", respectively by the CPU 5 and an input/cutoff datum of "0" is inputted to the register 3 by the CPU 5 to be stored in the register 3. In this case, the second input terminal of the AND circuit 4 is supplied with an input/cutoff signal of "0", and hence, the logic of the AND circuit 4 does not hold. As a result, a carry signal outputted by the one-bit counter $2b$ is not inputted to the one-bit counter $2c$. Therefore, the one-bit counter $2c$ halts its count operation, and hence, the count value of the one-bit counter $2c$ does not change but remains to be "1".

The one-bit counters $2a$ and $2b$ conduct the aforementioned count operations, so as to change the count values of the one-bit counters $2b$ and $2a$. As a result, the count values of the three bits change in the order of "1, 0, 0", "1, 0, 1", "1, 1, 0" and "1, 1, 1". When a clock $CLK_1$ is generated after both the count values of the one-bit counters $2b$ and $2a$ become "1", the count values of the one-bit counters $2b$ and $2a$ change to "0" in the same manner as described above, thereby returning the count values of the two bits to "0, 0", namely, returning the count values of the three bits to "1, 0, 0". The counter 15 repeats this count-up operation, so as to repeatedly count the values in the range between 4 and 7. Thus, the range of the count values to be counted is decreased.

Also, in the case where the range of the count values is set between 0 and 3, the count values of the one-bit counters $2a$, $2b$ and $2c$ are initialized to be "0" by the CPU 5, and an input/cutoff datum of "0" is stored in the register 3 by the CPU 5. In this case, the one-bit counter $2c$ is not supplied with a carry signal, and hence, the one-bit counter $2c$ halts its count operation. As a result, the count value of the one-bit counter $2c$ does not change but remains to be "0", and the count values of the one-bit counters $2b$ and $2a$ change, so as to change the count values of the three bits in the order of "0, 0, 0", "0, 0, 1", "0, 1, 0" and "0, 1, 1". Thus, the values in the range between 0 and 3 are repeatedly counted up. Also in this manner, the range of the values to be repeatedly counted can be decreased.

Such a change of the range of the count values can be attained by providing a single set of the AND circuit 4 and the register 3. Accordingly, there is no need to provide a large number of reload registers correspondingly to the one-bit counters as in the conventional counter. Thus, the pattern area conventionally occupied by the reload registers can be eliminated.

In addition, there is no need to initialize the count value of each one-bit counter by the CPU every time the count value is overflowed, and hence, the load of the CPU 5 can be prevented from increasing.

Embodiment 2

Figure 3:
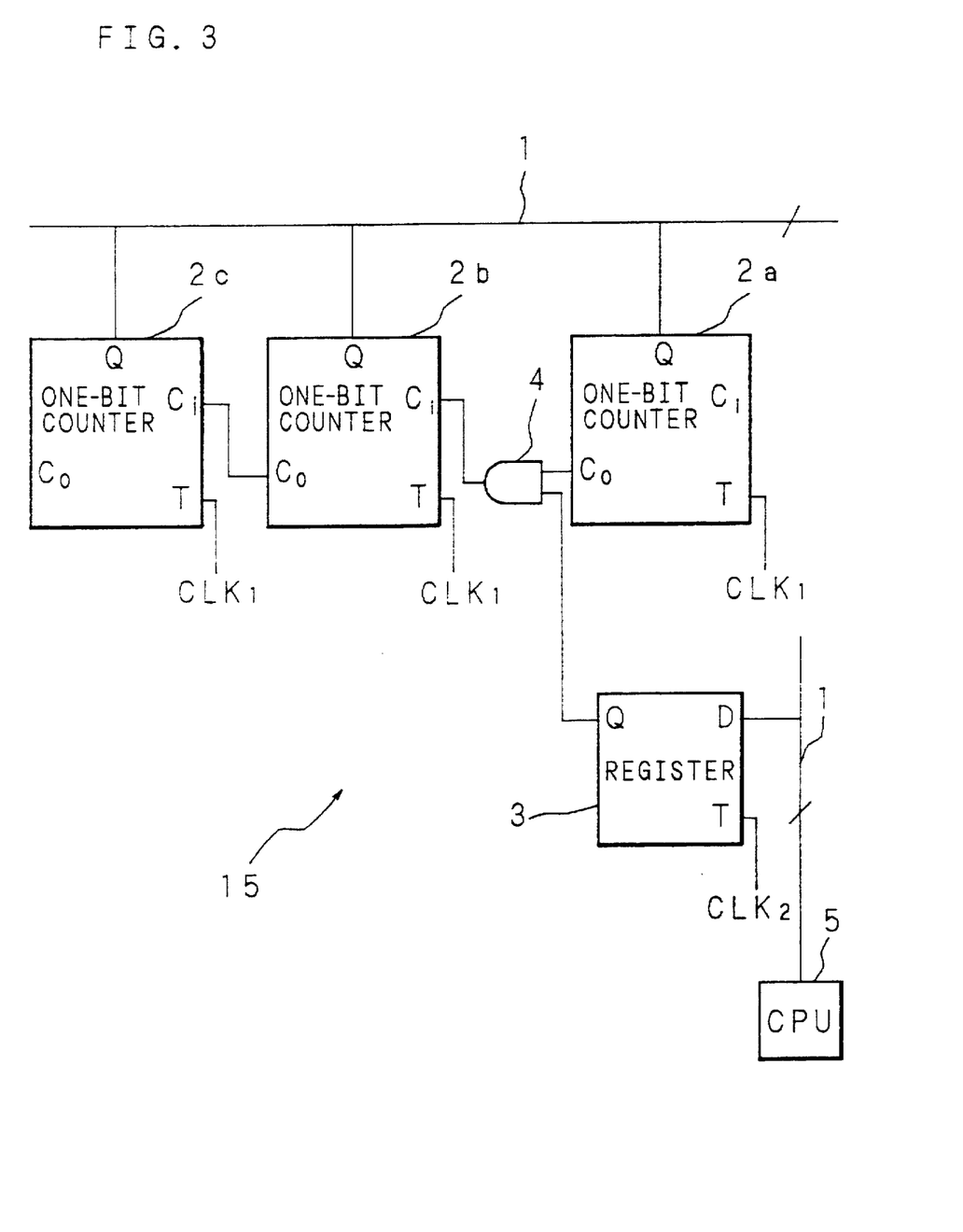
FIG. 3 is a block diagram for showing the configuration of a counting device according to a second embodiment of the invention.

FIG. 3 is a block diagram for showing the configuration of a counting device according to the second embodiment of the invention.

A carry signal outputted from the carry signal output terminal $C_o$ of a one-bit counter $2a$ is supplied to a first input terminal of an AND circuit 4. A carry signal outputted by the AND circuit 4 as its output signal is inputted to the carry signal input terminal $C_i$ of a one-bit counter $2b$. A carry signal outputted from the carry signal output terminal $C_o$ of the one-bit counter 2b is inputted to the carry signal input terminal $C_i$ of a one-bit counter 2c. The remaining configuration is similar to that of the counter shown in FIG. 2, and hence, like reference numerals are used to refer to like elements.

The counter having the aforementioned configuration is operated as follows:

When an input/cutoff datum of "1" is stored in the register 3, the second input terminal of the AND circuit 4 is supplied with an input/cutoff signal of "1". When the count values of the one-bit counters 2c, 2b and 2a are initialized to be "0" by the CPU 5, the count values of the one-bit counters 2c, 2b and 2a become "0" respectively. When a first clock $CLK_1$ is generated, the count value of the one-bit counter 2a changes from "0" to "1", resulting in the count values of the three bits of "0, 0, 1". When a second clock $CLK_1$ is generated, the count value of the one-bit counter 2a changes from "1" to "0", and a carry signal is simultaneously generated so as to be supplied to the first input terminal of the AND circuit 4. As a result, the logic of the AND circuit 4 holds, and a carry signal outputted by the AND circuit 4 as its output signal is inputted to the carry signal input terminal $C_i$ of the one-bit counter 2b. Thus, the count value of the one-bit counter 2b changes from "0" to "1", resulting in the count values of the three bits of "0, 1, 0".

Then, a carry signal outputted by the one-bit counter 2a can be supplied to the one-bit counter 2b, and a carry signal outputted by the one-bit counter 2b can be supplied to the one-bit counter 2c, thereby changing the count values of the one-bit counters 2a, 2b and 2c. Therefore, when an input/cutoff datum of "1" is stored in the register 3, this counter conducts the count-up operation in the same manner as in the case where the register 3 of FIG. 2 stores the input/cutoff datum of "1". As a result, the count values of the three bits change in the order of "0, 0, 0", "0, 0, 1", "0, 1, 0", "0, 1, 1", "1, 0, 0", "1, 0, 1", "1, 1, 0" and "1, 1, 1". Thus, the values in the range between 0 and 7 are counted.

In the case where the range of the count values to be repeatedly counted is set between 0 and 1, the count values of the one-bit counters 2c, 2b and 2a are initialized to be "0" respectively. As a result, the count values of the three bits become "0, 0, 0". When an input/cutoff datum of "0" is stored in the register 3, the second input terminal of the AND circuit 4 is supplied with an input/cutoff signal of "0". In this case, the logic of the AND circuit 4 does not hold, and hence, a carry signal outputted by the one-bit counter 2a is not supplied to the subsequent one-bit counter 2b. As a result, the count operations of the one-bit counters 2c and 2b are halted. In other words, the count values of the one-bit counters 2c and 2b do not change but remain to be "0", and hence, the count values of the three bits change in the order of "0, 0, 0" and "0, 0, 1". Thus, the values in the range between 0 and 1 are repeatedly counted. In this manner, the range of the count values is minimized extremely.

Embodiment 3

Figure 4:
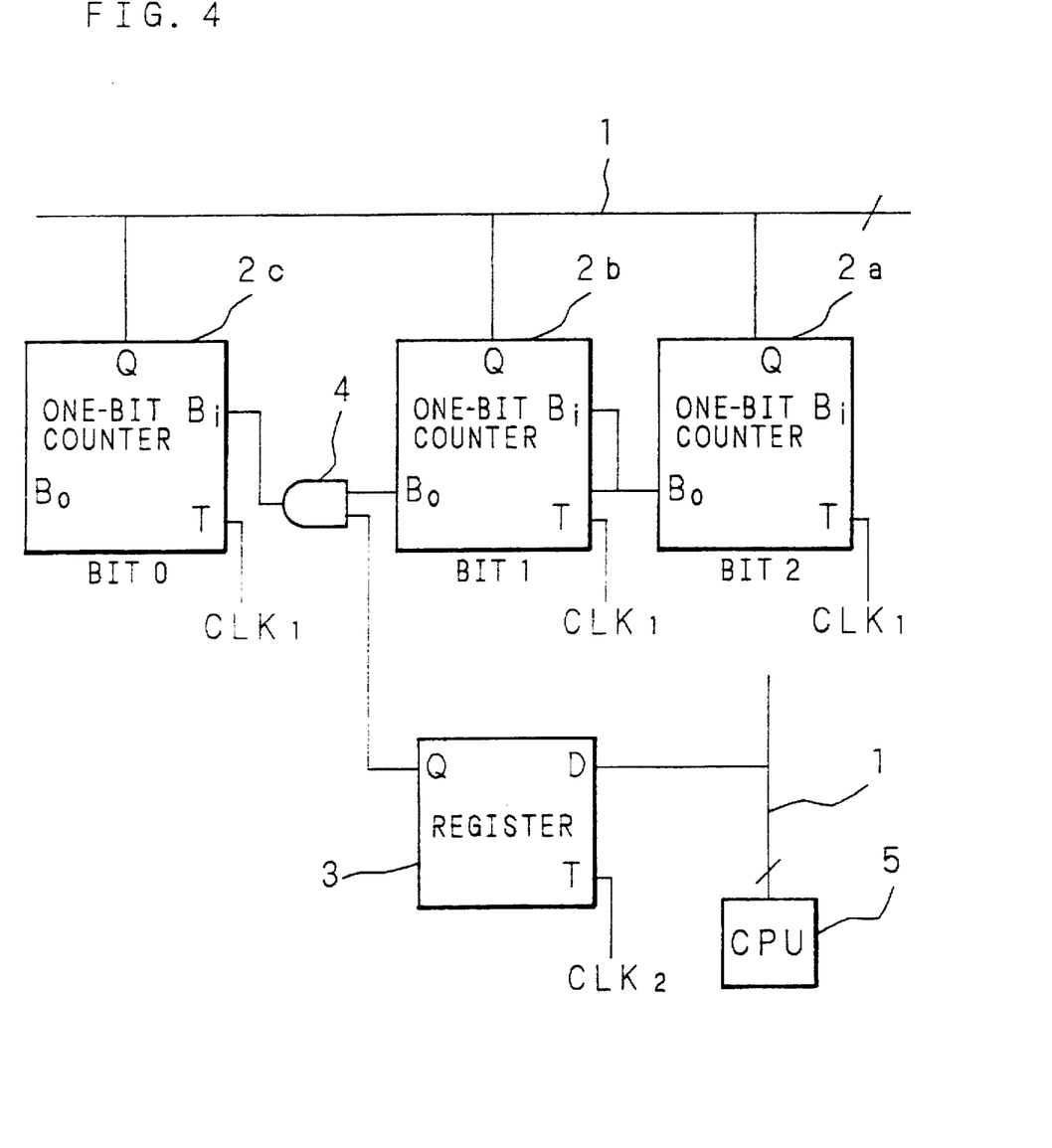
FIG. 4 is a block diagram for showing the configuration of a counting device according to a third embodiment of the invention.

FIG. 4 is a block diagram for showing the configuration of a counting device according to the third embodiment of the invention.

A borrow signal outputted from the borrow signal output terminal $B_u$ of a one-bit counter 2a is supplied to the borrow signal input terminal Bi of a one-bit counter 2b. A borrow signal outputted form the borrow signal output terminal $B_o$ of the one-bit counter 2b is supplied to a first input terminal of an AND circuit 4. A borrow signal outputted by the AND circuit 4 as its output signal is supplied to the borrow signal input terminal $B_i$ of a one-bit counter 2c. The remaining configuration is similar to that of the counter shown in FIG. 2, and like reference numerals are used to refer to like elements. This counter conducts a count-down operation by using a borrow signal differently from the counter shown in FIG. 2 using a carry signal.

The counter having the aforementioned configuration is operated as follows:

When an input/cutoff datum of "1" is inputted to the register 3 through the system bus 1 by the CPU 5 to be stored in the register 3, an input/cutoff signal of "1" derived from the input/cutoff datum is outputted from the output terminal Q of the register 3 to be supplied to the second input terminal of the AND circuit 4. When the count values of the one-bit counters 2c, 2b and 2a are initialized to be "1" by the CPU 5, the count values of the three bits become "1, 1, 1". When a first clock $CLK_1$ is then generated, the count value of the one-bit counter 2a changes from "1" to "0", resulting in the count values of the three bits of "1, 1, 0".

When a second clock $CLK_1$ is subsequently generated, the count value of the one-bit counter 2a changes from "0" to "1", and a borrow signal is simultaneously generated, so as to be supplied to the borrow signal input terminal $B_i$ of the subsequent one-bit counter 2b. As a result, the count value of the one-bit counter 2b changes from "1" to "0", resulting in the count values of the three bits of "1, 0, 1". When a third clock $CLK_1$ is subsequently generated, the count value of the one-bit counter 2a changes to "0". At this point, a borrow signal is not generated, and hence, the count value of the one-bit counter 2b remains to be "0", resulting in the count values of the three bits of "1, 0, 0".

When a fourth clock $CLK_1$ is subsequently generated, the count value of the one-bit counter 2a changes from "0" to "1", and a borrow signal is generated. The borrow signal is supplied to the borrow signal input terminal $B_i$ of the one-bit counter 2b, so as to change the count value of the one-bit counter 2b from "0" to "1". At this point, the one-bit counter 2b generates a borrow signal to be supplied to the first input terminal of the AND circuit 4. The second input terminal of the AND circuit 4 is supplied with the input/cutoff signal of "1" by the register 3, and hence, the logic of the AND circuit 4 holds. Therefore, the AND circuit 4 outputs a borrow signal to be supplied to the borrow signal input terminal $B_i$ of the subsequent one-bit counter 2c.

As a result, the count value of the one-bit counter 2c changes from "1" to "0", resulting in the count values of the three bits of "0, 1, 1". Thereafter, the one-bit counters conduct the count-down operations in the aforementioned manner every time a clock is generated, thereby changing the count values of the three bits in the order of "1, 1, 1", "1, 1, 0", "1, 0, 1", "1, 0, 0", "0, 1, 1", "0, 1, 0", "0, 0, 1" and "0, 0, 0". Thus, the values in the range between 7 and 0 are counted down.

After all the count values of the one-bit counters 2c, 2b and 2a become "0", when a subsequent clock is generated, the count value of the one-bit counter 2a changes from "0" to "1". A borrow signal is simultaneously generated, thereby changing the count value of the one-bit counter 2b from "0" to "1". As a result, the one-bit counter 2b generates a borrow signal, thereby changing the count value of the one-bit counter 2c from "0" to "1", resulting in returning the count values of the three bits to "1, 1, 1", i.e., the initial values. The counter repeats this count-down operation, thereby repeatedly counting down the values in the range between 7 and 0.

In the case where the range of the count values to be repeatedly counted is set between 7 and 4, the count values of the one-bit counters 2c, 2b and 2a are set at "1", "1" and "1", respectively by the CPU 5, and an input/cutoff datum of "0" is stored in the register 3 by the CPU 5. In this case, the second input terminal of the AND circuit 4 is supplied with an input/cutoff signal of "0", and hence, the logic of the AND circuit 4 does not hold. As a result, a borrow signal outputted by the one-bit counter $2b$ is not inputted to the one-bit counter $2c$, and hence, the one-bit counter $2c$ halts its count operation and the count value of the one-bit counter $2c$ does not change but remains to be "1". The one-bit counters $2a$ and $2b$ conduct the count-down operations in the same manner as described above, thereby changing the count values of the one-bit counters $2b$ and $2a$. As a result, the count values of the three bits change in the order of "1, 1, 1", "1, 1, 0", "1, 0, 1" and "1, 0, 0". When a clock $CLK_1$ is generated after both the count values of the one-bit counters $2a$ and $2b$ become "0", the count values of the one-his counters $2b$ and $2a$ change to "1" in the aforementioned manner, thereby returning the count values of the two bits to "1, 1", namely returning the count values of the three bits to "1, 1, 1". The counter repeats this count-down operation, thereby repeatedly counting down the values in the range between 7 and 4. Thus, the range of the count values to be repeatedly counted is decreased.

In the case where the range of the count values to be repeatedly counted is set between 3 and 0, the count values of the one-bit counters $2c$, $2b$ and $2a$ are initialized to be "0", "1" and "1", respectively, and an input/cutoff datum of "0" is stored in the register 3 by the CPU 5. In this case, the one-bit counter $2c$ halts its count operation, and the count value of the one-bit counter $2c$ does not change but remains to be "0". The count values for the one-bit counters $2b$ and $2a$ change, thereby changing the count values of the three bits in the order of "0, 1, 1", "0, 1, 0", "0, 0, 1" and "0, 0, 0". Thus, the count-down operation of the values in the range between 3 and 0 is repeated. Also in this manner, the range of the count values to be repeatedly counted is decreased. Such a change of the range of the count values can be attained by providing a single set of the AND circuit 4 and the register 3. Accordingly, there is no need to provide a large number of reload registers correspondingly to the one-bit counters as in the conventional counter, and hence, the pattern area conventionally occupied by the reload registers can be eliminated.

In addition, there is no need to initialize the count value of each one-bit counter by the CPU every time the count value is underflowed, and hence, the load of the CPU 5 can be prevented from increasing.

Embodiment 4

Figure 5:
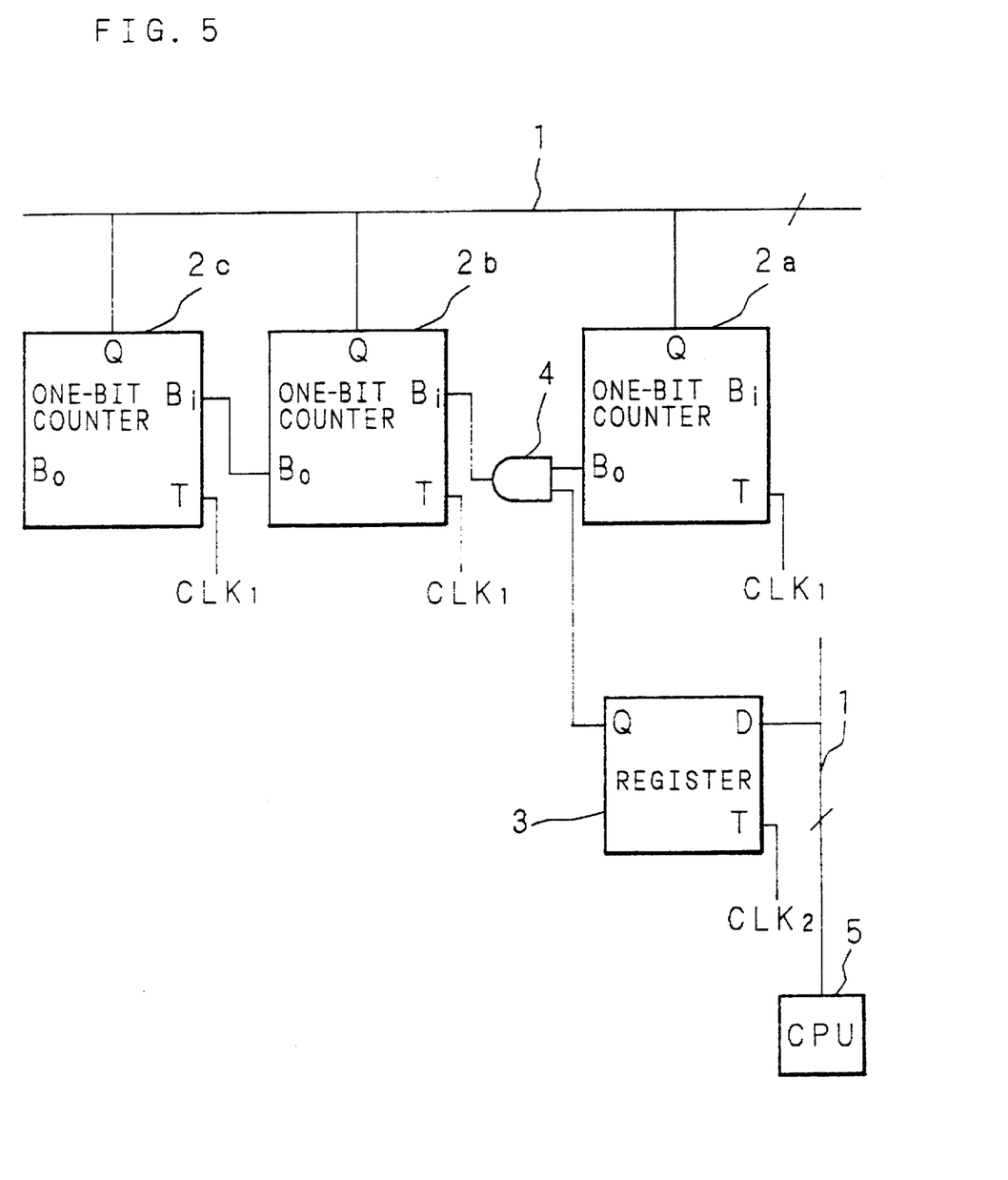
FIG. 5 is a block diagram for showing the configuration of a counting device according to a fourth embodiment of the invention.

FIG. 5 is a block diagram for showing the configuration of a counting device according to the fourth embodiment of the invention.

A borrow signal outputted from the borrow signal output terminal $B_o$ of a one-bit counter $2a$ is supplied to a first input terminal of an AND circuit 4. A borrow signal outputted by the AND circuit 4 as its output signal is supplied to the borrow signal input terminal $B_i$ of a one-bit counter $2b$. A borrow signal outputted from the borrow signal output terminal $B_o$ of the one-bit counter $2b$ is supplied to the borrow signal input terminal $B_j$ of a one-bit counter $2c$. The remaining configuration is similar to that of the counter shown in FIG. 4, and like reference numerals are used to refer to like elements.

The counter having the aforementioned configuration is operated as follows:

When an input/cutoff datum of "1" is stored in the register 3, the second input terminal of the AND circuit 4 is supplied with an input/cutoff signal of "1". After the count values of the one-bit counters $2c$, $2b$ and $2a$ are initialized to be "1" by the CPU 5, when a first clock $CLK_1$ is generated, the count value of the one-bit counter $2a$ changes from "1" to "0", resulting in the count values of the three bits of "1, 1, 0". When a second clock $CLK_1$ is generated, the count value of the one-bit counter $2a$ changes from "0" to "1", and a borrow signal is simultaneously generated to be supplied to the first input terminal of the AND circuit 4. As a result, the logic of the AND circuit 4 holds, and hence, a borrow signal outputted by the AND circuit 4 as its output signal is supplied to the borrow signal input terminal $B_i$ of the one-bit counter $2b$. Thus, the count value of the one-bit counter $2b$ changes from "1" to "0", thereby changing the count values of the three bits to "1, 0, 1".

Then, a borrow signal outputted by the one-bit counter $2a$ can be supplied to the one-bit counter $2b$, and a borrow signal outputted by the one-bit counter $2b$ can be supplied to the one-bit counter $2c$, thereby changing the count values of the one-bit counters $2c$, $2b$ and $2a$. Therefore, when an input/cutoff data of "1" is stored in the register 3, this counter conducts the count-down operation in the same manner as in the case where the input/cutoff datum of "1" is stored in the register 3 of the counter shown in FIG. 4. As a result, the count values of the three bits change in the order of "1, 1, 1", "1, 1, 0", "1, 0, 1", "1, 0, 0", "0, 1, 1", "0, 1, 0", "0, 0, 1" and "0, 0, 0". Thus, the values in the range between 7 and 0 are counted down.

In the case where the range of the count values to be repeatedly counted is set between 7 and 6, the count values of the one-bit counters $2c$, $2b$ and $2a$ are initialized to be "1", and an input/cutoff datum of "0" is stored in the register 3. As a result, the second input terminal of the AND circuit 4 is supplied with an input/cutoff signal of "0". In this case, the logic of the AND circuit 4 does not hold, and hence, a borrow signal outputted by the one-bit counter $2a$ is not supplied to the subsequent one-bit counter $2b$, and a borrow signal outputted by the one-bit counter $2b$ is not supplied to the subsequent one-bit counter $2c$. Therefore, the one-bit counters $2c$ and $2b$ do not conduct their count operations. In other words, the count values of the one-bit counters $2c$ and $2b$ do not change but remain to be "1". The count values of the three bits change in the order of "1, 1, 1" and "1, 1, 0". Thus, the values in the range between 7 and 6 are repeated counted. In this manner, the range of the count values to be repeatedly counted is minimized extremely.

Figure 6:
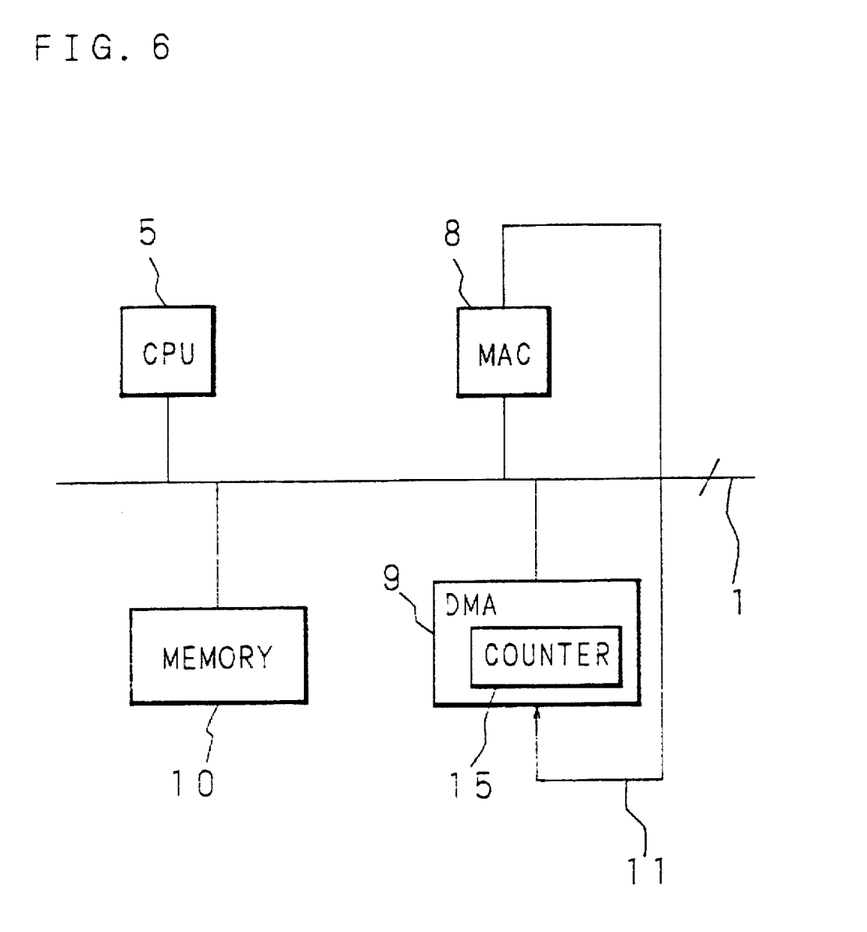
FIG. 6 is a diagram for showing the configuration of a system in which the counting device of the invention is applied to a DMA (direct memory access)

FIG. 6 is a diagram for showing the configuration of a system in which the counting device of this invention is applied to a DMA (direct memory access).

A CPU 5, a MAC (multiply and accumulate) 8, a DMA 9 including the counter 15 of the first embodiment and a memory 10 are connected with a system bus 1. An operation completion signal 11 outputted by the MAC 8 is supplied to the DMA 9. The DMA 9 transfers data not through the CPU 5 but directly on the basis of a transfer byte count set by the CPU 5 and addresses in the memory 10, to and from which data are transferred. Therefore, when the MAC 8 executes its operation and the DMA 9 receives the operation completion signal 11 in this system, the DMA 9 writes the obtained operation datum in the memory 10. The DMA 9 uses the count value of the built-in counter 15 therein as the address of an operation datum stored in the memory 10, so that the latest operation datum of the MAC 8 can be successively overwritten on the oldest operation datum.

When the counter of this invention is applied to a DMA, the DMA can be made remarkably compact since the counter is very small. As a result, the entire system can be made compact. In addition, when the range of count values to be repeatedly counted is changed, there is no need to reload each one-bit counter with an initial value every time the count value is overflowed/underflowed. Therefore, the load of the CPU 5 in the system is prevented from increasing.

Three one-bit counters are used in each of the aforementioned embodiments, but this number of the one-bit counters is only an example and does not limit the invention. Also, in the case where a plurality of one-bit counters are used, the location of the AND circuit for inputting/cutting off a carry signal or a borrow signal can be appropriately determined and is not limited to that shown in each of the above-described embodiments.

Figure 7:
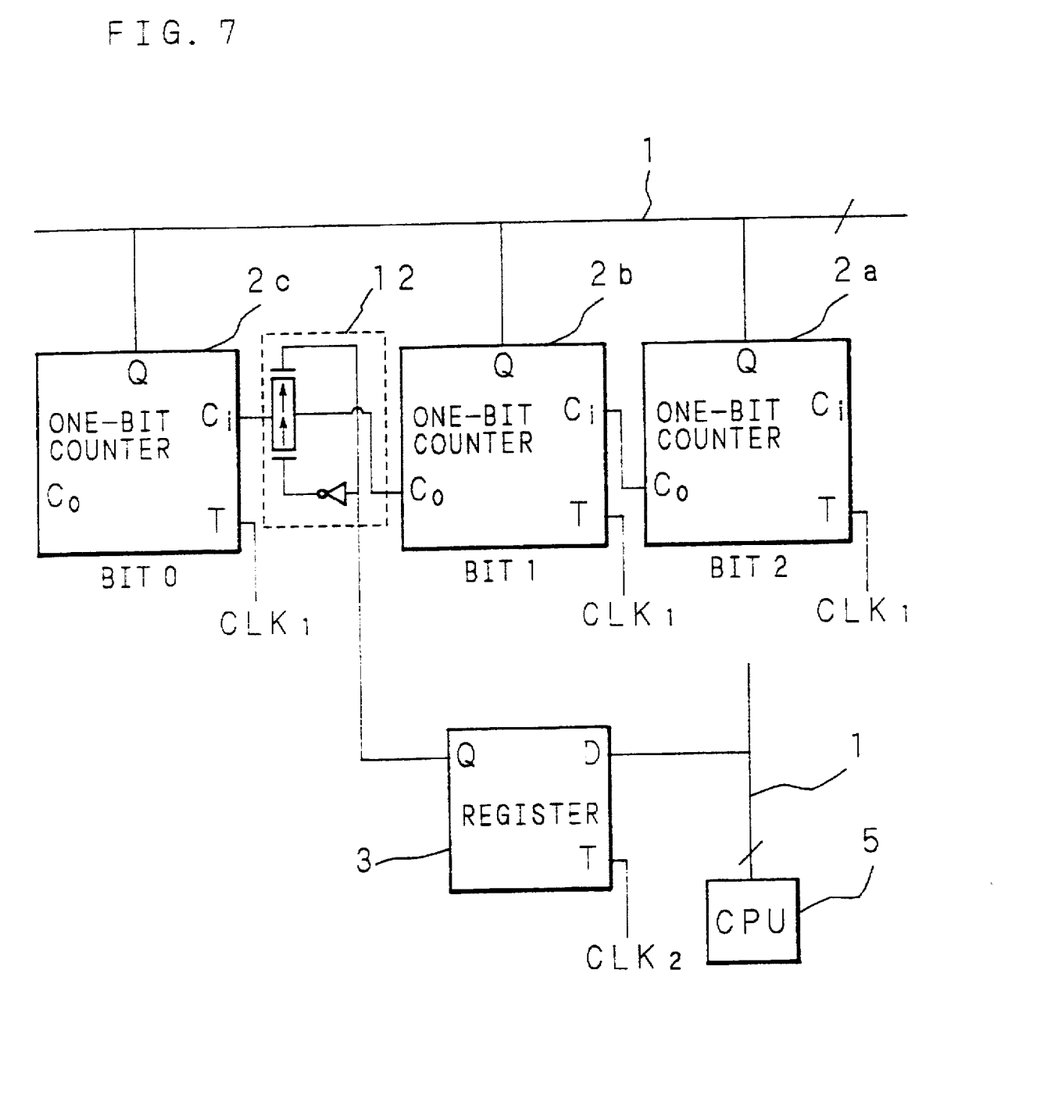
FIG. 7 is a block diagram for showing the configuration of a counting device as modification of the first embodiment obtained by replacing an AND circuit with a transfer gate.
Figure 8:
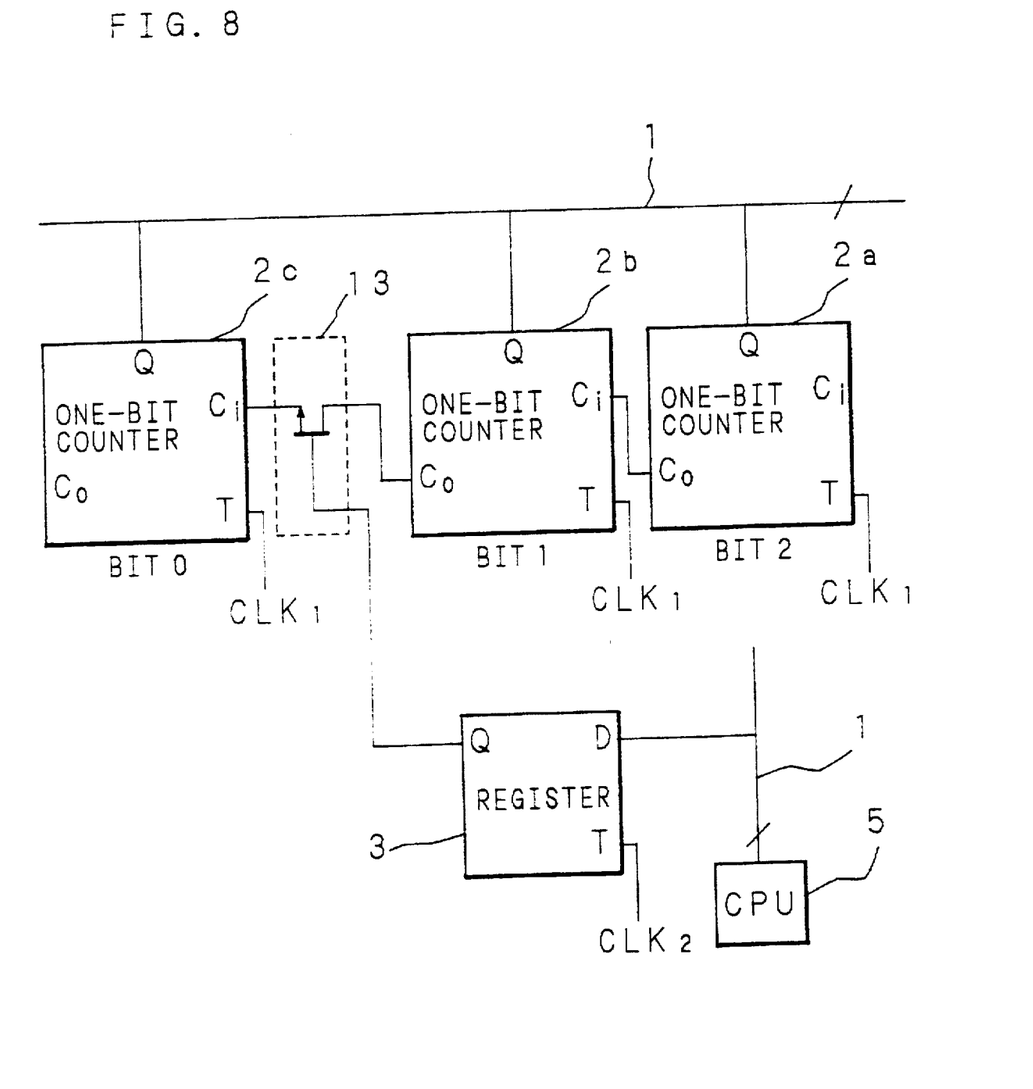
FIG. 8 is a block diagram for showing the configuration of a counting device as another modification of the first embodiment obtained by replacing the AND circuit with an analog switch.
Figure 9:
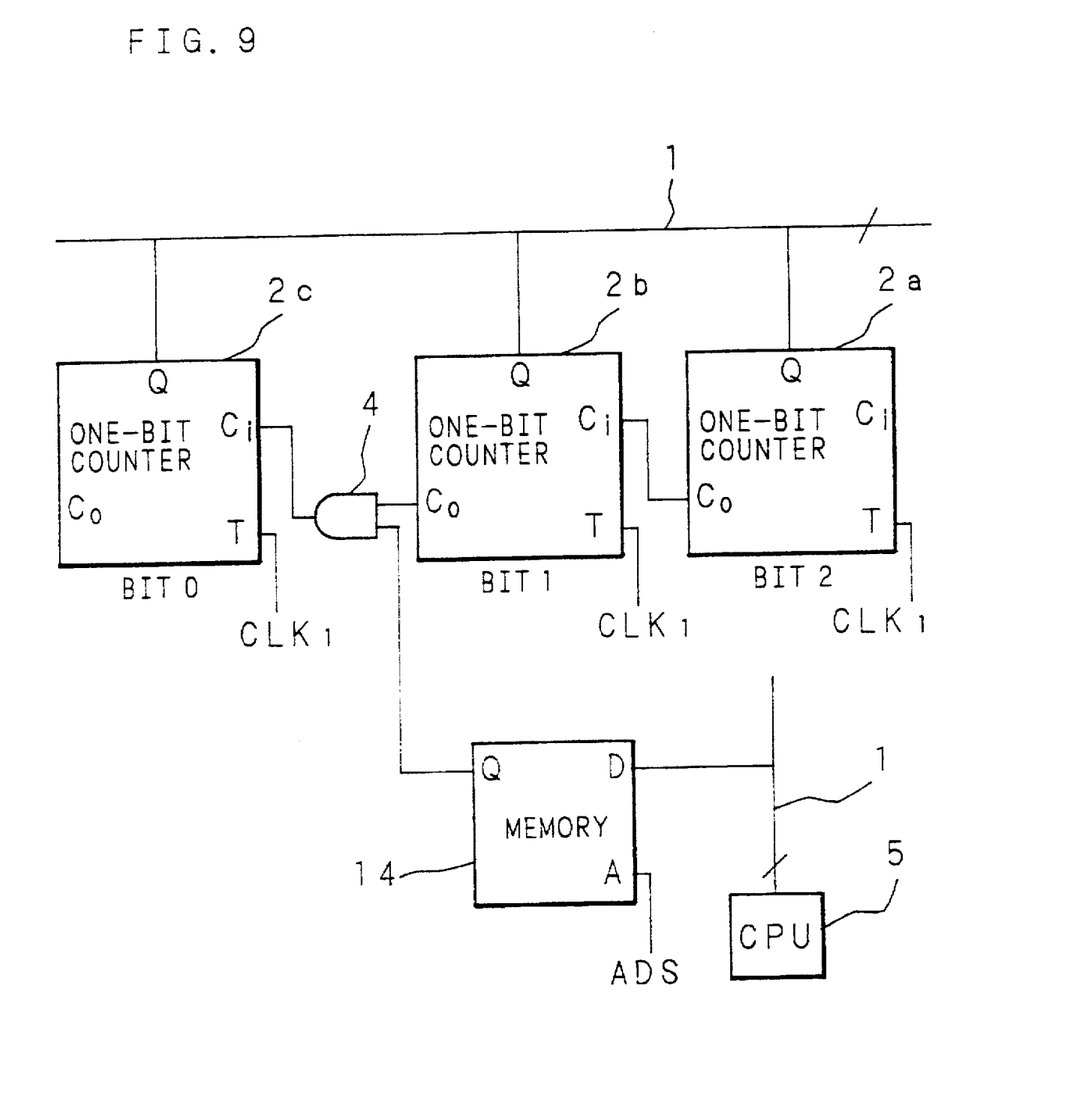
FIG. 9 is a block diagram for showing the configuration of a counting device as still another modification of the first embodiment obtained by replacing a register with a memory.

Furthermore, as is shown in FIGS. 7 through 9, the AND circuit can be replaced with a transfer gate or an analog switch, and the register can be replaced with a memory. FIG. 7 shows the configuration of a counter in which the AND circuit 4 of the first embodiment is replaced with a transfer gate 12. As is shown in FIG. 7, the transfer gate 12 receives a carry signal from the one-bit counter 2b at its data input terminal and also receives an input/cutoff signal from the register 3 and an inverted signal thereof at its control input terminals. In accordance with the levels, i.e., "0" or "1", of the input/cutoff signal and the inverted signal, a carry signal from the one-bit counter 2b is supplied to the one-bit counter 2c or cut off.

Also, FIG. 8 shows the configuration of a counting device in which the fiND circuit 4 of the first embodiment is replaced with an analog switch 13. As is shown in FIG. 8, the analog switch 13 consists of an FET. The FET supplies a carry signal from the one-bit counter 2b to the one-bit counter 2c or cuts off the carry signal in accordance with the levels, i.e., "0" or "1", of the input/cutoff signal from the register 3 and an inverted signal thereof.

FIG. 9 shows the configuration of a counting device in which the register 3 of the first embodiment is replaced with a memory 14. As is shown in FIG. 9, the input terminal D of the memory 14 is supplied with input/cutoff data by the CPU 5, an ADS input terminal A thereof is supplied with a signal ADS for specifying an address in the memory, and an input/cutoff signal is outputted from the output terminal Q thereof to the AND circuit 4.

Each of the counting devices shown in FIGS. 7 through 9 can attain the same effects as those of the first embodiment. In addition, the counting devices of the second through fourth embodiments can be modified by using a transfer gate, an analog switch or a memory in the same manner, and the modified counting devices can attain the same effects.

Furthermore, an application of the present counting device to a DMA is described above, but this application is merely an example and the application of the invention is not limited to the aforementioned system.

As described in detail above, an operation mode for repeatedly counting count values in a predetermined bit ravage is commanded in this invention. On the basis of the commanded operation mode, a mask signal is generated so as to mask a carry signal or a borrow signal generated during a count operation. By using the mask signal, the count operation of the one-bit counter(s) corresponding to higher bits(s) than a predetermined bit is halted. Therefore, when the carry signal or the borrow signal is not masked, all the one-bit counters are operated so as to repeatedly count the count values in a wide range. When the carry signal or the borrow signal is masked, the count operation of the one-bit counter(s) corresponding to higher bit(s) than a predetermined bit is halted, so as to repeatedly count the count values in a narrow range.

Moreover, the counting device of the invention comprises input/cutoff means for inputting/cutting off a carry signal or a borrow signal to be inputted to one-bit counter corresponding to higher bit than the predetermined bit and input/cutoff signal outputting means for outputting a signal for controlling the input/cutoff means. By transferring the carry signal or the borrow signal through the input/cutoff means, all the one-bit counters are operated so as to enlarge the range of the count values to be repeatedly counted. By cutting off the carry signal, the count operation of the one-bit counter(s) corresponding to higher bit(s) than a predetermined bit is halted, so as to decrease the range of the count values to be repeatedly counted. Accordingly, the change of the range of the count values to be repeatedly counted does not require a large number of reload registers correspondingly to the one-bit counters as in the conventional counter, and thus, the pattern area conventionally occupied by the reload registers can be eliminated. Therefore, when the counter of the invention is applied to a system including a CPU, the entire system can be remarkably made compact and the load of the CPU can be prevented from increasing.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A counting device for repeatedly counting count values in a predetermined bit range, comprising:

a plurality of one-bit counters having a carry/borrow output terminal and a carry/borrow input terminal, the carry/borrow output terminal of each counter being connected with the carry/borrow input terminal of the counter in a subsequent stage such that a carry/borrow signal generated during a count operation is supplied from one of the one-bit counters to another one-bit counter in a subsequent stage;

means for supplying an instruction to repeatedly count the count values in a range corresponding to at least a part of the one-bit counters;

a means, selected from one of either a register and a memory, for outputting a mask signal, for masking the carry/borrow signal, in accordance with the instruction; and a single means, connected between the carry/borrow output terminal of a predetermined one-bit counter and the carry/borrow input terminal of a one-bit counter in a subsequent stage of the predetermined one-bit counter, for receiving the carry/borrow signal outputted by the predetermined one-bit counter and said mask signal so as to halt a count operation of the one-bit counter in the subsequent stage of the predetermined one-bit counter in accordance with the mask signal.

2. A counting device for repeatedly counting count values in a predetermined bit range, comprising:

a plurality of one-bit counters having a carry/borrow output terminal and a carry/borrow input terminal, the carry/borrow output terminal of each counter being connected with the carry/borrow input terminal of the counter in a subsequent stage such that a carry/borrow signal generated during a count operation is supplied from one of the one-bit counters to another one-bit counter in a subsequent stage;

a single input/cutoff means interposed between the carry/borrow output terminal of a predetermined one-bit counter and the carry/borrow input terminal of another one-bit counter in a subsequent stage of the predetermined one-bit counter for inputting/cutting off the carry/borrow signal to be supplied to the one-bit counter in the subsequent stage; and a means, selected from one of either a register and a memory, for outputting a control signal for the input/cutoff means.

3. The counting device according to claim 1, wherein each of the one-bit counters is a flip-flop.

4. The counting device according to claim 1, wherein the means for supplying the instruction is a CPU.

5. The counting device according to claim 1, wherein the means for receiving the carry/borrow signal so as to halt the count operation is an AND circuit.

6. The counting device according to claim 1, wherein the means for receiving the carry/borrow signal so as to halt the count operation is a transfer gate.

7. The counting device according to claim 1, wherein the means for receiving the carry/borrow signal so as to halt the count operation is an analog switch.

8. The counting device according to claim 2, wherein each of the one-bit counters is a flip-flop.

9. The counting device according to claim 2, wherein the input/cutoff means is an AND circuit.

10. The counting device according to claim 2, wherein the input/cutoff means is a transfer gate.

11. The counting device according to claim 2, wherein the input/cutoff means is an analog switch.

12. A direct memory access system in which a memory is directly accessed not through a CPU, comprising:

a counting device which uses a count value as an address in the memory, wherein the counting device includes:

a plurality of one-bit counters having a carry/borrow output terminal and a carry/borrow input terminal, the carry/borrow output terminal of each counter being connected with the carry/borrow input terminal of the counter in a subsequent stage such that a carry/borrow signal generated during a count operation is supplied from one of the one-bit counters to another one-bit counter in a subsequent stage;

means for supplying an instruction to repeatedly count values in a range corresponding to at least a part of the one-bit counters;

a means, selected from one of either a register and a memory, for outputting a mask signal, for masking the carry/borrow signal, in accordance with the instruction; and a single means, connected between the carry/borrow output terminal of a predetermined one-bit counter and the carry/borrow input terminal of a one-bit counter in a subsequent stare of the predetermined one-bit counter, for receiving the carry/borrow signal outputted by the predetermined one-bit counter and said mask signal so as to halt a count operation of the one-bit counter in the subsequent stage of the predetermined one-bit counter in accordance with the mask signal.

\* \* \* \* \*

UNITED STATES PATENT AND TRADEMARK OFFICE
CERTIFICATE OF CORRECTION

PATENT NO.   : 5,737,381
DATED        : April 7, 1998
INVENTOR(S)  : Takehiko SHIMOMURA et al It is certified that error appears in the above-identified patent and that said Letters Patent is hereby corrected as shown below:

Title page,
    item [30], delete "Feb. 16, 1996" and insert -- Feb. 26, 1996 --.

Signed and Sealed this

Twenty-eighth Day of July, 1998

Attest:

BRUCE LEHMAN

Attesting Officer     Commissioner of Patents and Trademarks